(12) United States Patent
Chu et al.

(10) Patent No.: US 10,872,763 B2
(45) Date of Patent: Dec. 22, 2020

(54) TREATMENTS TO ENHANCE MATERIAL STRUCTURES

(71) Applicant: Applied Materials, Inc., Santa Clara, CA (US)

(72) Inventors: David Chu, Campbell, CA (US); Steven C. Hung, Sunnyvale, CA (US); Malcolm J. Bevan, Santa Clara, CA (US); Charles Chu, Santa Clara, CA (US); Tatsuya E. Sato, San Jose, CA (US); Shih-Chung Chen, Cupertino, CA (US); Patricia M. Liu, Saratoga, CA (US); Johanes Swenberg, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/403,312

(22) Filed: May 3, 2019

(65) Prior Publication Data
US 2020/0350157 A1    Nov. 5, 2020

(51) Int. Cl.
*H01L 21/02* (2006.01)
*H01L 21/28* (2006.01)

(52) U.S. Cl.
CPC .. *H01L 21/02205* (2013.01); *H01L 21/02172* (2013.01); *H01L 21/02323* (2013.01); *H01L 21/02329* (2013.01); *H01L 21/28158* (2013.01); *H01L 21/02123* (2013.01)

(58) Field of Classification Search
CPC ......... H01L 21/02205; H01L 21/02323; H01L 21/02329; H01L 21/28158
See application file for complete search history.

(56) References Cited

U.S. PATENT DOCUMENTS

| 6,348,420 | B1 | 2/2002 | Raaijmakers et al. |
| 6,617,639 | B1 * | 9/2003 | Wang ................ H01L 21/28194 257/324 |
| 6,627,503 | B2 | 9/2003 | Ma et al. |
| 6,723,581 | B1 | 4/2004 | Chabal et al. |
| 6,806,145 | B2 | 10/2004 | Haukka et al. |
| 6,821,873 | B2 | 11/2004 | Visokay et al. |
| 6,921,702 | B2 | 7/2005 | Ahn et al. |
| 6,953,721 | B2 | 10/2005 | Agarwal |

(Continued)

OTHER PUBLICATIONS

Hasan, MD. Mehedi, "Work Function Tuning in Sub-20nm Titanium Nitride (TiN) Metal Gate: Mechanism and Engineering," King Abdullah University of Science and Technology, Thuwal, Kingdom of Saudi Arabia, Jul. 2011, 68 pages.

(Continued)

*Primary Examiner* — William Coleman
(74) *Attorney, Agent, or Firm* — Kilpatrick Townsend & Stockton LLP (57) ABSTRACT

Processing methods may be performed to produce semiconductor structures that may include a high-k dielectric material. The methods may include delivering a nitrogen-containing precursor or an oxygen-containing precursor to a substrate contained in a semiconductor processing chamber. The methods may include forming reactive ligands on an exposed surface of the substrate with the nitrogen-containing precursor or the oxygen-containing precursor. The methods may also include forming a high-k dielectric material overlying the substrate.

16 Claims, 3 Drawing Sheets

(56) References Cited

U.S. PATENT DOCUMENTS

| | | | |
|---|---|---|---|
| 6,956,267 B2 * | 10/2005 | Hattangady | H01L 21/28202 257/288 |
| 7,084,078 B2 | 8/2006 | Ahn et al. | |
| 7,700,988 B2 | 4/2010 | Lin et al. | |
| 8,420,208 B2 | 4/2013 | Huang et al. | |
| 8,778,816 B2 | 7/2014 | Sato et al. | |
| 10,347,492 B2 | 7/2019 | Hung et al. | |
| 2005/0124121 A1 | 6/2005 | Rotondaro et al. | |
| 2010/0102376 A1 | 4/2010 | Ma et al. | |
| 2010/0239758 A1 | 9/2010 | Kher et al. | |
| 2011/0124172 A1 | 5/2011 | Jeong et al. | |
| 2011/0207314 A1 | 8/2011 | Niimi et al. | |
| 2012/0088356 A1 | 4/2012 | Santhanam et al. | |
| 2016/0005832 A1 | 1/2016 | Chang et al. | |
| 2018/0218911 A1 | 8/2018 | Hung et al. | |
| 2019/0287805 A1 | 9/2019 | Hung et al. | |

OTHER PUBLICATIONS

Filliot, F. et al., "Study of metal gate work function modulation using plasma and SiH4 treated TiN thin films," Article, Mat. Res. Soc. Symp. Proc. vol. 786, 2004, Accessed Online https://www.researchgate.net/publication/232003039, 8 pages.

"Electron Work Function of the Elements", https://public.wsu.edu/pchemlab/documents/Workunctionvalues.pdf.

International Search Report and Written Opinion dated Aug. 5, 2020 in International Patent Application No. PCT/US2020/028071, 9 pages.

* cited by examiner

TREATMENTS TO ENHANCE MATERIAL STRUCTURES

TECHNICAL FIELD

The present technology relates to semiconductor systems, processes, and equipment. More specifically, the present technology relates to treatments to enhance material formation in gate structures.

BACKGROUND

Logic gate performance is related to the characteristics of the materials used as well as the thickness and area of the structural layers. However, as some gate characteristics are adjusted to accommodate device scaling, challenges arise. For example, with a silicon oxide gate dielectric, capacitance may improve as thickness is reduced, which may lead to higher channel mobility and faster device performance. However, as the thickness continues to reduce, gate leakage may impact the device, and may cause reductions in device yield. High-k materials have been adopted for the gate dielectric to reduce the effective oxide thickness while limiting impact to the gate leakage. Efforts to maximize particular high-k materials have been limited due to morphology issues related to the formation of the high-k materials.

Thus, there is a need for improved systems and methods that can be used to maximize the performance of the high-k materials and enable the production of high quality devices and structures. These and other needs are addressed by the present technology.

SUMMARY

Processing methods may be performed to produce semiconductor structures that may include a high-k dielectric material. The methods may include delivering a nitrogen-containing precursor or an oxygen-containing precursor to a substrate contained in a semiconductor processing chamber. The methods may include introducing reactive ligands on an exposed surface of the substrate with the nitrogen-containing precursor or the oxygen-containing precursor. The methods may also include forming a high-k dielectric material overlying the substrate.

In some embodiments, the nitrogen-containing precursor may be or include a first nitrogen-containing precursor and the oxygen-containing precursor may be or include a first oxygen-containing precursor. The methods may also include, subsequent forming the high-k dielectric material, treating the high-k dielectric material with a second nitrogen-containing precursor or a second oxygen-containing precursor. The second nitrogen-containing precursor may be or include a thermally-activated nitrogen-containing precursor or a plasma-enhanced nitrogen-containing precursor. The treating may incorporate nitrogen into the high-k dielectric material in an amount that is less than or about 10 atomic %. The methods may also include, subsequent forming the high-k dielectric material, performing a thermal anneal. The forming a high-k dielectric material may include performing an atomic layer deposition process. The nitrogen-containing precursor may be or include ammonia. The substrate may be maintained at a temperature above or about 300° C. while delivering the ammonia. The substrate may be or include a silicon-containing material. The high-k dielectric material may be or include at least one element selected from the group consisting of hafnium, zirconium, silicon, lanthanum, aluminum, titanium, and strontium.

Some embodiments of the present technology may also encompass methods of forming a semiconductor structure. The methods may include pre-treating a substrate by contacting the substrate with a nitrogen-containing precursor or an oxygen-containing precursor. The methods may include forming a high-k dielectric material overlying the pre-treated substrate in a first semiconductor processing chamber housing the pre-treated substrate. The methods may include transferring the substrate to a second semiconductor processing chamber. The methods may also include post-treating the high-k dielectric material.

In some embodiments, the post-treating may include exposing the substrate and high-k dielectric material to an oxygen-containing precursor or a nitrogen-containing precursor. The methods may include, subsequent the post-treating, annealing the high-k dielectric material. Transferring the substrate to a second semiconductor processing chamber may include transferring the substrate between two chambers on a multi-chamber processing system. The transferring may be performed while maintaining vacuum conditions on the multi-chamber processing system. The nitrogen-containing precursor for the pre-treating may be or include ammonia. The substrate may be maintained at a temperature below about 700° C. while the ammonia is delivered to the substrate. The pre-treating may be performed for less than or about one minute. The substrate may be or include a silicon-containing material, and an exposed surface layer of the silicon-containing material may be silicon. The silicon-containing material may be or include silicon oxide. The high-k dielectric material may be or include at least one element selected from the group consisting of hafnium, zirconium, silicon, lanthanum, aluminum, titanium, and strontium.

Some embodiments of the present technology may also encompass methods of forming a semiconductor structure. The methods may include pre-treating a substrate including a silicon-containing material by contacting the substrate with a nitrogen-containing precursor or an oxygen-containing precursor while maintaining the substrate at a first temperature greater than or about 400° C. The methods may include forming a high-k dielectric material overlying the pre-treated substrate while maintaining the pre-treated substrate at a second temperature less than the first temperature. The methods may also include post-treating the high-k dielectric material with an anneal performed at a third temperature greater than or about the same temperature as the first temperature.

Such technology may provide numerous benefits over conventional systems and techniques. For example, the processes may produce a more preferred structure of the high-k dielectric materials. Additionally, the produced high-k materials may be characterized by reduced gate leakage compared to the same high-k dielectric materials formed conventionally. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As logic gate structures scale to smaller dimensions, new material structures are being sought to provide improvements. The use of high-k dielectrics increases the dielectric constant of the gate stack over conventional gate stacks that utilize materials such as silicon oxide. However, similar to silicon oxide, as material thicknesses are reduced, gate leakage increases. For example, gate leakage increases as the effective oxide thickness decreases. Hence, the inverse relationship between gate leakage and effective oxide thickness may form a limit on the performance of the transistor and the device produced.

High-k dielectric materials may provide greater channel mobility over silicon oxide at similar thicknesses. As the industry continues to seek lower effective oxide thicknesses along without increased gate leakage, efforts to maximize the k-value of known high-k materials are reaching limits due to morphological characteristics. Conventional technologies have struggled to overcome natural characteristics of high-k materials, which may set an upper limit in the dielectric constant, and subsequent device remodeling in attempts to incorporate new films.

The present technology overcomes these issues by improving the characteristics of high-k dielectric materials themselves. By producing high-k dielectric materials exhibiting a specific morphology or grain structure according to embodiments of the present technology, higher dielectric constants and subsequent improved device performance may be enabled. In order to control grain formation in exemplary devices, treatments may be performed to provide activated substrate surfaces that can induce a specific grain growth, as well as to stabilize films after formation, which may result in a higher dielectric constant.

Although the remaining disclosure will routinely identify specific deposition and treatment processes utilizing the disclosed technology, it will be readily understood that the systems and methods are equally applicable to a variety of other processes as may occur in the described chambers. Accordingly, the technology should not be considered to be so limited as for use with the described treatment and deposition processes alone. The disclosure will discuss one possible system that can be used with the present technology to perform certain elements of the deposition or treatment operations before describing operations of an exemplary process sequence according to the present technology. It is to be understood that the technology is not limited to the equipment described, and processes discussed may be performed in any number of processing chambers and systems.

Figure 1:
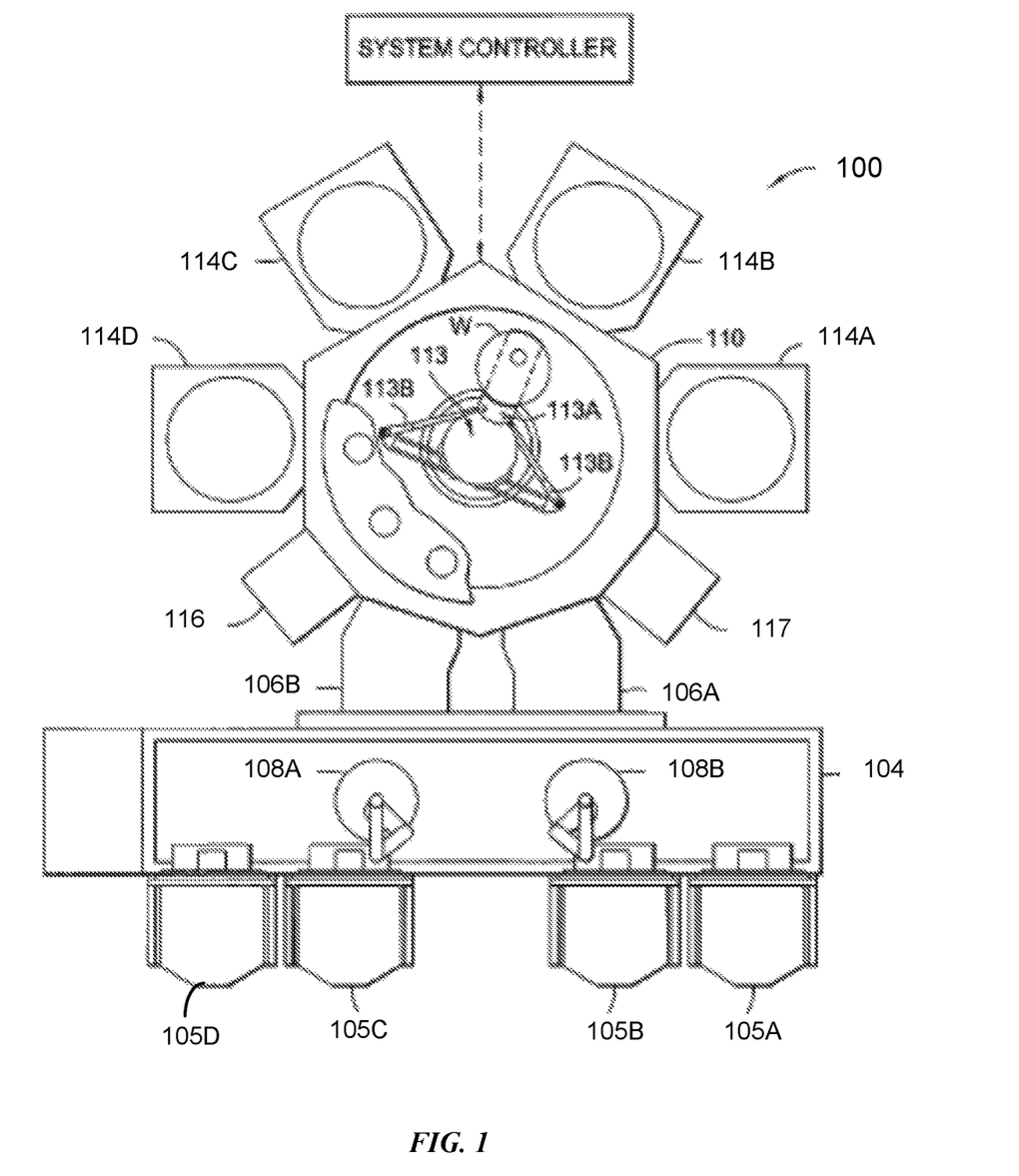
FIG. 1 shows a top plan view of an exemplary processing system according to embodiments of the present technology.

FIG. 1 shows a top plan view of one embodiment of a processing system 100 of deposition, etching, baking, and/or curing chambers according to embodiments. The tool or processing system 100 depicted in FIG. 1 may contain a plurality of process chambers, 114A-D, a transfer chamber 110, a service chamber 116, an integrated metrology chamber 117, and a pair of load lock chambers 106A-B. The process chambers may include any number of structures or components, as well as any number or combination of processing chambers.

To transport substrates among the chambers, the transfer chamber 110 may contain a robotic transport mechanism 113. The transport mechanism 113 may have a pair of substrate transport blades 113A attached to the distal ends of extendible arms 113B, respectively. The blades 113A may be used for carrying individual substrates to and from the process chambers. In operation, one of the substrate transport blades such as blade 113A of the transport mechanism 113 may retrieve a substrate W from one of the load lock chambers such as chambers 106A-B and carry substrate W to a first stage of processing, for example, a treatment process as described below in chambers 114A-D. The chambers may be included to perform individual or combined operations of the described technology. For example, while one or more chambers may be configured to perform a deposition or formation operation, one or more other chambers may be configured to perform a pre-treatment operation and/or one or more of the post-treatment operations described. Any number of configurations are encompassed by the present technology, which may also perform any number of additional fabrication operations typically performed in semiconductor processing.

If the chamber is occupied, the robot may wait until the processing is complete and then remove the processed substrate from the chamber with one blade 113A and may insert a new substrate with a second blade (not shown). Once the substrate is processed, it may then be moved to a second stage of processing. For each move, the transport mechanism 113 generally may have one blade carrying a substrate and one blade empty to execute a substrate exchange. The transport mechanism 113 may wait at each chamber until an exchange can be accomplished.

Once processing is complete within the process chambers, the transport mechanism 113 may move the substrate W from the last process chamber and transport the substrate W to a cassette within the load lock chambers 106A-B. From the load lock chambers 106A-B, the substrate may move into a factory interface 104. The factory interface 104 generally may operate to transfer substrates between pod loaders 105A-D in an atmospheric pressure clean environment and the load lock chambers 106A-B. The clean environment in factory interface 104 may be generally provided through air filtration processes, such as HEPA filtration, for example. Factory interface 104 may also include a substrate orienter/aligner (not shown) that may be used to properly align the substrates prior to processing. At least one substrate robot, such as robots 108A-B, may be positioned in factory interface 104 to transport substrates between various positions/locations within factory interface 104 and to other locations in communication therewith. Robots 108A-B may be configured to travel along a track system within factory interface 104 from a first end to a second end of the factory interface 104.

The processing system 100 may further include an integrated metrology chamber 117 to provide control signals, which may provide adaptive control over any of the processes being performed in the processing chambers. The integrated metrology chamber 117 may include any of a variety of metrological devices to measure various film properties, such as thickness, roughness, composition, and the metrology devices may further be capable of characterizing grating parameters such as critical dimensions, sidewall angle, and feature height under vacuum in an automated manner.

Each of processing chambers 114A-D may be configured to perform one or more process steps in the fabrication of a semiconductor structure, and any number of processing chambers and combinations of processing chambers may be used on multi-chamber processing system 100. For example, any of the processing chambers may be configured to perform a number of substrate processing operations including any number of deposition processes including cyclical layer deposition, atomic layer deposition, chemical vapor deposition, physical vapor deposition, as well as other operations including etch, pre-clean, pre-treatment, post-treatment, anneal, plasma processing, degas, orientation, and other substrate processes. Some specific processes that may be performed in any of the chambers or in any combination of chambers may be metal deposition, surface cleaning and preparation, thermal annealing such as rapid thermal processing, and plasma processing. Any other processes may similarly be performed in specific chambers incorporated into multi-chamber processing system 100, including any process described below, as would be readily appreciated by the skilled artisan.

Figure 2:
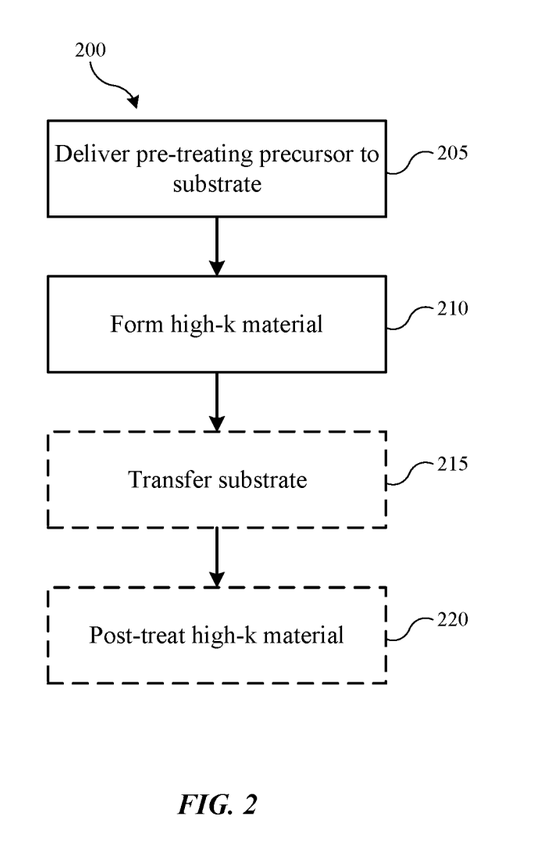
FIG. 2 shows selected operations in a method of forming a semiconductor structure according to embodiments of the present technology.
Figure 3A:
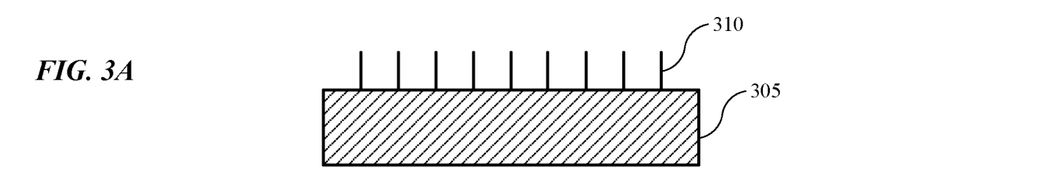
FIGS. 3A-3C show schematic cross-sectional views of exemplary substrates according to embodiments of the present technology.
Figure 3B:
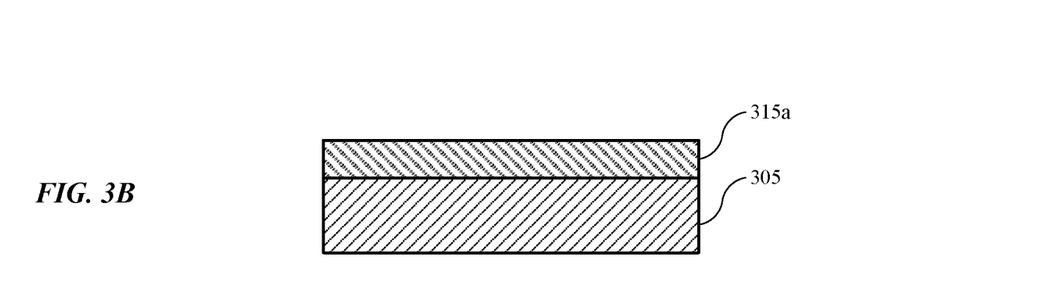
Figure 3C:
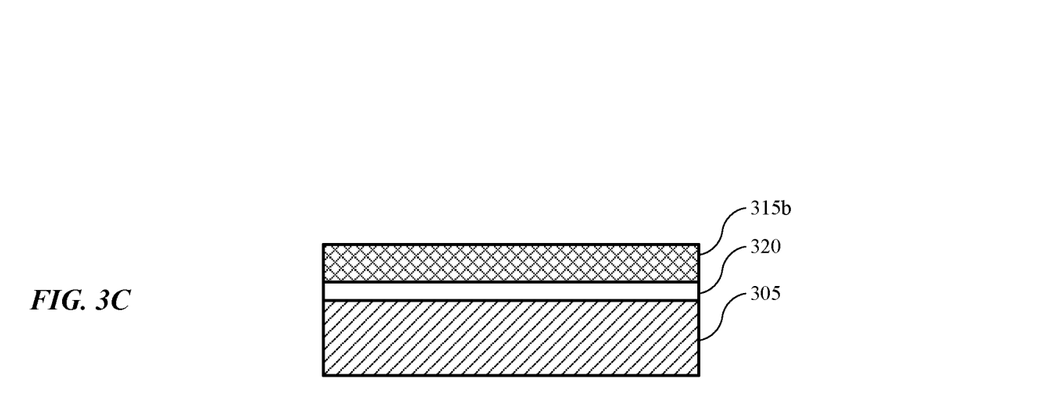

FIG. 2 illustrates a method 200 of forming a semiconductor structure, operations of which may be performed, for example, in one or more chambers incorporated on multi-chamber processing system 100 as previously described. Method 200 may include one or more operations prior to the initiation of the stated method operations, including front end processing, deposition, etching, polishing, cleaning, or any other operations that may be performed prior to the described operations. The method may include a number of optional operations as denoted in the figure, which may or may not specifically be associated with the method according to the present technology. For example, many of the operations are described in order to provide a broader scope of the structural formation process, but are not critical to the technology, or may be performed by alternative methodology as will be discussed further below. Method 200 describes the operations shown schematically in FIGS. 3A-3C, the illustrations of which will be described in conjunction with the operations of method 200. It is to be understood that FIG. 3 illustrates only partial schematic views, and a substrate may contain any number of transistor sections and additional materials having aspects as illustrated in the figures.

Method 200 may involve optional operations to develop the semiconductor structure to a particular fabrication operation. Although in some embodiments method 200 may be performed on a base structure, in some embodiments the method may be performed subsequent other material formation. As illustrated in FIG. 3A, the semiconductor structure may represent a device 300 after certain processing has been completed. For example, substrate 305 may be a planar material, or may be a structured device, which may include one or more materials configured as or defining posts, trenches, or other structures as would be understood are similarly encompassed by the present technology. Substrate 305 may include any number of materials including silicon or silicon-containing materials such as oxides, nitrides, and carbides of silicon, as well as any other materials that may be incorporated within a structure.

One or more material layers may be formed over some or all of substrate 305, as well as formed at least partially within the substrate, to produce a structure that may be a planarized or structured material in embodiments. As non-limiting examples, substrate 305 may be or include silicon, or may include a surface amount of silicon formed over an additional material, such as silicon oxide, and which may be a reduced portion of the silicon oxide leaving a silicon exposed surface. The exposed material at a surface of substrate 305 may be etched, planarized, or otherwise processed to produce an intermittent pattern in some embodiments. Although illustrated as a single instance, it is to be understood that device 300 may include a small section of a larger process integration that may include any number of additional sections that may be similar or different to the objects shown. Substrate 305 may be housed or positioned in a processing region of a semiconductor processing chamber, and method 200 may be performed to produce a semiconductor material on the substrate, such as a high-k dielectric material.

Method 200 may include delivering a pre-treatment precursor to the substrate in operation 205. The pre-treatment precursor may be or include a nitrogen-containing precursor or an oxygen-containing precursor. The precursor may contact the substrate and may form or introduce reactive ligands on an exposed surface of the substrate, which is shown as ligands 310 in FIG. 3A. Unlike conventional technologies, the present technology may utilize a pre-treatment configured to produce an orderly growth of high-k dielectric material in subsequent operations.

For example, in some embodiments the substrate may be or include an exposed surface of silicon. The substrate 305 may itself be silicon, or may be some other silicon-containing material that is reduced or modified to exhibit a silicon surface. As one non-limiting example, where substrate 305 may include silicon oxide, an initial pre-treatment may include removing oxygen from a surface of the structure, such as with a hydrogen-containing precursor, for example. A thin, surface layer of silicon may then be exposed. Without being bound to any particular theory, silicon may provide improved base characteristics for receiving nitrogen-containing precursors relative to silicon oxide in some embodiments. This may afford a superior formation of certain high-k dielectric materials.

The pre-treatment precursor may be or include any nitrogen-containing or oxygen-containing precursor. Oxygen-containing precursors may be characterized by a hydroxyl group [—OH], which may be incorporated on the surface of substrate 305. Nitrogen-containing precursors may be characterized by an amine group [—$NH_2$], or other nitrogen-containing group. For example, nitrogen-containing precursors may be or include nitrogen-and-hydrogen-containing precursors, such as ammonia as one non-limiting example, or nitrogen-and-oxygen-containing precursors, or any other precursor including nitrogen.

The surface terminations in some embodiments may be or include a hydroxyl group or an amine-group-terminated surface. Method 200 may then include forming a high-k dielectric material overlying the substrate at operation 210. The present technology may encompass any formation or deposition of the high-k material, although in some embodiments formation operation 210 may be or include an atomic layer deposition, or any other atomic layer deposition chamber. The formation may be performed directly after pre-treating the substrate surface, and may be performed in the same chamber as the pre-treatment or in an additional chamber, such as an additional chamber incorporated on the same system, such as system 100. In some embodiments, vacuum conditions may be maintained while the substrate is transferred from the pre-treatment chamber to the deposition or formation chamber, which may limit exposure of the substrate to air.

Where an atomic layer deposition process is performed to form the high-k dielectric material, a metal-containing precursor may be delivered to the substrate to react with the pre-treated surface. For example, a transition-metal-containing precursor, a poor-metal-containing precursor, or a lanthanide-metal-containing precursor may be delivered to the processing chamber to interact with the reactive ligands exposed on the substrate from the pre-treatment. An oxygen-containing precursor may then be delivered in a second operation, such as subsequent a purge of the metal-containing precursor. This may produce an oxide layer by atomic layer deposition, such as layer 315 as illustrated in FIG. 3B. In one non-limiting example, a hafnium-containing precursor may be delivered in a first operation and an oxidant may be delivered in a second operation for producing a hafnium oxide film. Additional metal-containing precursors may include zirconium-containing precursors for producing zirconium-containing materials, as well as any other number of metal-containing precursors for producing additional metal oxide structures. For hafnium-containing precursors, and similarly for any alternative metals, the precursors may be or include halogen-containing precursors, oxygen-containing precursors, hydrogen-containing precursors, or carbon-containing precursors in any of which hafnium is incorporated.

For the oxidant, any oxygen-containing precursor may be used that may react with the metal-containing materials. For example, the oxygen-containing precursor may be or include water, diatomic oxygen, ozone, a hydroxyl-containing precursor or alcohol, nitrogen-and-oxygen-containing precursors, plasma-enhanced oxygen including locally or remotely enhanced oxygen, or any other material including oxygen that may be incorporated with the metal, such as hafnium, to produce a metal oxide material layer overlying the substrate. Again, any of the metal-containing materials noted above may be used in embodiments of the present technology, and may include any of the grouped metals, which may include, and may not be limited to, hafnium, zirconium, silicon, lanthanum, aluminum, titanium, strontium, or combinations of these materials, such as, for example, hafnium silicate.

When pre-treatments according to embodiments of the present technology are performed, the structure of the metal-containing material can be formed or deposited in an ordered way to produce a more uniform grain structure. This may be produced by forming the reactive ligands of the pre-treatment precursor over a more structured surface material, such as silicon. Additionally, by performing the pre-treatment exposure at certain conditions, additional improvements may be afforded.

The pre-treatment may be performed at a temperature configured to activate the precursor and/or the surface of the substrate. For example, in a situation in which a nitrogen-and-hydrogen-containing precursor may be used as the pre-treatment precursor, the substrate may be maintained at a temperature greater than or about 300° C. while delivering the precursor. Similarly, a pre-treatment with an oxygen-containing precursor may also be performed while maintaining a substrate temperature greater than or about 300° C. For any pre-treatment operation the substrate may also be maintained at a temperature greater than or about 400° C., greater than or about 500° C., greater than or about 600° C., greater than or about 700° C., greater than or about 800° C., or greater. As temperature for the pre-treatment decreases below or about 500° C., the effectiveness may be reduced. Similarly, as temperatures are increased above or about 700° C., nucleation may not be improved, and excess precursor may be incorporated on the surface, which may degrade the mobility of the device. Consequently, in some embodiments the temperature may be maintained between about 500° C. and about 700° C. during the pre-treatment.

Similarly, exposure time may affect the amount of nitrogen-containing precursor incorporation, and thus to limit mobility losses of the produced device, the precursor exposure may be less than or about 3 minutes, and in some embodiments the exposure time may be less than or about 2.5 minutes, less than or about 2 minutes, less than or about 1.5 minutes, less than or about 1 minute, less than or about 45 seconds, less than or about 30 seconds, less than or about 15 seconds, or less. Once an appropriate amount of amine groups have been incorporated, the formation may be performed. The formation, including atomic layer formation may be performed at any temperature, although in some embodiments atomic layer deposition may be performed at a temperature below or about the temperature at which the pre-treatment is performed, regardless of whether the operations are performed in the same or different chambers. For example, the atomic layer deposition may be performed at a second temperature relative to the pre-treatment temperature, and the formation temperature may be less than or about 500° C. in embodiments, and may be less than or about 450° C., less than or about 400° C., less than or about 350° C., less than or about 300° C., less than or about 250° C., or less.

After the layer of high-k material has been formed or deposited, one or more post-treatments may be performed. In some embodiments, the substrate may be transferred from the deposition chamber to another chamber or set of chambers for post-treating the materials at optional operation 215. Similar to that explained above, the transfer may occur on a single processing system having multiple chambers, and thus the transfer from or between any of these chambers may be performed while maintaining vacuum conditions. Method 200 may then include one or more additional post-treatment operations as noted by optional operation 220. The post-treatment operations may include one or more operations performed in one or more chambers, including multiple chambers on the same cluster tool. Post-treatment operations may include an oxidation, a nitridation, and/or a thermal anneal.

As noted above, the pre-treatment operation may be performed to provide sufficient terminal moieties to afford the uniform growth described previously, while limiting excess precursor from being incorporated with the substrate. For example, an incorporated nitrogen interface may reduce mobility of the produced transistor, or how quickly a carrier can move through the structure. Although the pre-treatment described above may further improve scaling of high-k films, if not controlled, the pre-treatment may actually degrade device mobility. However, in some embodiments, one post-treatment may include oxidizing the formed high-k material with a second oxygen-containing precursor relative to a first oxygen-containing precursor that may be used in the pre-treatment operation.

For example, an oxidation operation utilizing any of the above-noted oxygen-containing precursors may be performed to further oxidize the film after formation. The deposition or formation of the high-k film may produce a porous film, or a film including vacancies in the structure. By performing an oxidation operation, oxygen species may permeate the film filling vacancies, as well as producing an oxide material at the interface of the high-k material, such as optional layer 320 illustrated in FIG. 3C. This may improve the underlying interface from the amine terminal groups, which may increase the mobility performance of the device. To limit an excessive increase in an underlying oxide layer, the oxidation operation may be performed for a limited time period, and may be performed within any of the previously noted time ranges.

Post-treatment operations may additionally include further contacting the substrate with a second nitrogen-containing precursor relative to the pre-treatment nitrogen-containing precursor, when used. The second nitrogen-containing precursor may include any nitrogen-containing precursor described above, and may include nitrogen gas, as well as any nitrogen-containing precursor noted elsewhere. The second nitrogen-containing precursor may include a plasma-activated or enhanced nitrogen-containing precursor, a thermally-activated nitrogen, or some other nitrogen precursor, which may allow nitrogen radicals or nitrogen atoms to be incorporated within the high-k structure, which may stabilize the film or settle the film towards an equilibrium state. Unlike an oxidation operation, the nitridation may not increase a thickness of an underlying layer, such as silicon oxide, and may also slightly increase the k-value of the produced film.

Nitrogen incorporation may be controlled to limit the incorporation in the film, in order to maintain the structural and electrical properties. In some embodiments, a post-treatment nitridation may incorporate less than or about 20 atomic % nitrogen at a surface region of the high-k film, and may incorporate less than or about 15 atomic % nitrogen, less than or about 10 atomic % nitrogen, less than or about 8 atomic % nitrogen, less than or about 6 atomic % nitrogen, less than or about 4 atomic % nitrogen, less than or about 2 atomic % nitrogen, or less. In some embodiments, an incorporation between about 3 atomic % and about 7 atomic % may maintain a higher k-value than higher nitrogen incorporation, and may better stabilize the film than lower nitrogen incorporation. By surface region may be meant an exposed surface of the material, although the nitrogen incorporation may extend to any distance within the film, and may be consistent, or form a reducing gradient through the material.

A post-treatment oxidation or nitridation may be performed at any of the temperatures noted previously, although in some embodiments the post-treatment oxidation and/or nitridation may be performed at a temperature range below or about 500° C., and may be performed at a temperature range below or about 400° C., below or about 300° C., below or about 200° C., below or about 100° C., or less depending on the operation being performed.

A post-treatment anneal may be performed subsequent any of the operations, including any of the noted post-treatment operations. The post-treatment anneal may be performed in any chamber in which a previous operation is performed, or may involve transfer to a different chamber, such as one configured to perform a rapid thermal anneal process, for example. Again, the chamber may be incorporated on the same platform as other chambers, which may allow a transfer between chambers while maintaining vacuum conditions. The post-treatment anneal may further align the film bonding and further stabilize the film. In embodiments the post-treatment anneal may be performed at a third temperature relative to the first temperature, where the third temperature may be above or about the first temperature. For example, the post-treatment anneal may be performed at a temperature above or about 400° C., and in embodiments may be performed at a temperature above or about 500° C., above or about 600° C., above or about 700° C., above or about 800° C., above or about 900° C., or higher.

By performing a pre-treatment and/or post-treatments according to embodiments of the present technology, improved high-k materials may be produced. The layer of high-k material may be produced to any thickness including up to or about several nanometers. However, due to the preferred grain structure produced by the present technology, thinner effective oxide thickness may be produced without loss to gate leakage performance. High-k materials produced according to the present technology may be characterized by k-values greater than or about 10, and may be characterized by k-values greater than or about 15, greater than or about 20, greater than or about 21, greater than or about 22, greater than or about 23, greater than or about 24, greater than or about 25, or greater.

As noted above, the present technology further allows improved dielectric constants compared to conventional technologies. Additionally, because of the produced grain structure, gate leakage currents associated with the film may be less than or about one tenth of the gate leakage current of a similar thickness film of silicon oxide, and the gate leakage currents may be less than or about one hundredth of the gate leakage current of a similar thickness film of silicon oxide, less than or about one thousandth of a similar thickness film of silicon oxide, less than or about $1/5,000$ of a similar thickness film of silicon oxide, less than or about $1/10,000$ of a similar thickness film of silicon oxide, less than or about $1/20,000$ of a similar thickness film of silicon oxide, less than or about $1/50,000$ of a similar thickness film of silicon oxide, less than or about $1/100,000$ of a similar thickness film of silicon oxide, or less. By producing films according to embodiments of the present technology, formed films having a beneficial morphology may be produced, which may enhance the electrical characteristics of the film compared to conventional technologies.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a layer" includes a plurality of such layers, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of forming a semiconductor structure, the method comprising:
   delivering a nitrogen-containing precursor or an oxygen-containing precursor to a substrate contained in a semiconductor processing chamber, wherein the nitrogen-containing precursor comprises a first nitrogen-containing precursor and the oxygen-containing precursor comprises a first oxygen-containing precursor;
   introducing reactive ligands on an exposed surface of the substrate with the nitrogen-containing precursor or the oxygen-containing precursor;
   forming a high-k dielectric material overlying the substrate; and
   treating the high-k dielectric material with a second nitrogen-containing precursor or a second oxygen-containing precursor, and wherein the treating incorporates nitrogen into the high-k dielectric material in an amount that is less than or about 10 atomic %.

2. The method of forming a semiconductor structure of claim 1, wherein the second nitrogen-containing precursor comprises a thermally-activated nitrogen-containing precursor or a plasma-enhanced nitrogen-containing precursor.

3. The method of forming a semiconductor structure of claim 1, further comprising, subsequent forming the high-k dielectric material, performing a thermal anneal.

4. The method of forming a semiconductor structure of claim 1, wherein the forming a high-k dielectric material comprises performing an atomic layer deposition process.

5. The method of forming a semiconductor structure of claim 1, wherein the nitrogen-containing precursor comprises ammonia.

6. The method of forming a semiconductor structure of claim 1, wherein the substrate comprises a silicon-containing material.

7. The method of forming a semiconductor structure of claim 1, wherein the high-k dielectric material comprises at least one element selected from the group consisting of hafnium, zirconium, silicon, lanthanum, aluminum, titanium, and strontium.

8. The method of forming a semiconductor structure of claim 5, wherein the substrate is maintained at a temperature above or about 300° C. while delivering the ammonia.

9. A method of forming a semiconductor structure, the method comprising:
   pre-treating a substrate by contacting the substrate with a nitrogen-containing precursor or an oxygen-containing precursor;
   forming a high-k dielectric material overlying the pre-treated substrate in a first semiconductor processing chamber housing the pre-treated substrate;
   transferring the substrate to a second semiconductor processing chamber; and
   post-treating the high-k dielectric material, wherein the post-treating comprises exposing the substrate and high-k dielectric material to an oxygen-containing precursor or a nitrogen-containing precursor, and wherein the post-treating incorporates nitrogen into the high-k dielectric material in an amount that is less than or about 10 atomic %.

10. The method of forming a semiconductor structure of claim 9, further comprising, subsequent the post-treating, annealing the high-k dielectric material.

11. The method of forming a semiconductor structure of claim 9, wherein transferring the substrate to a second semiconductor processing chamber comprises transferring the substrate between two chambers on a multi-chamber processing system, and wherein the transferring is performed while maintaining vacuum conditions on the multi-chamber processing system.

12. The method of forming a semiconductor structure of claim 9, wherein the nitrogen-containing precursor for the pre-treating comprises ammonia.

13. The method of forming a semiconductor structure of claim 9, wherein the substrate comprises a silicon-containing material, and wherein an exposed surface layer of the silicon-containing material comprises silicon.

14. The method of forming a semiconductor structure of claim 9, wherein the high-k dielectric material comprises at least one element selected from the group consisting of hafnium, zirconium, silicon, lanthanum, aluminum, titanium, and strontium.

15. The method of forming a semiconductor structure of claim 12, wherein the substrate is maintained at a temperature below about 700° C. while the ammonia is delivered to the substrate, and wherein the pre-treating is performed for less than or about one minute.

16. The method of forming a semiconductor structure of claim 13, wherein the silicon-containing material comprises silicon oxide.

* * * * *